United States Patent
Baringhaus

(10) Patent No.: US 12,538,566 B2
(45) Date of Patent: Jan. 27, 2026

(54) VERTICAL FIELD-EFFECT TRANSISTOR AND METHOD FOR FORMING SAME

(71) Applicant: Robert Bosch GmbH, Stuttgart (DE)

(72) Inventor: Jens Baringhaus, Sindelfingen (DE)

(73) Assignee: Robert Bosch GmbH, Stuttgart (DE)

(*) Notice: Subject to any disclaimer, the term of this patent is extended or adjusted under 35 U.S.C. 154(b) by 605 days.

(21) Appl. No.: 17/798,439

(22) PCT Filed: Feb. 15, 2021

(86) PCT No.: PCT/EP2021/053588
§ 371 (c)(1),
(2) Date: Aug. 9, 2022

(87) PCT Pub. No.: WO2021/165179
PCT Pub. Date: Aug. 26, 2021

(65) Prior Publication Data
US 2023/0070381 A1    Mar. 9, 2023

(30) Foreign Application Priority Data
Feb. 18, 2020 (DE) .................. 10 2020 202 015.9

(51) Int. Cl.
*H10D 84/83* (2025.01)
*H10D 30/01* (2025.01)
(Continued)

(52) U.S. Cl.
CPC ......... *H10D 84/834* (2025.01); *H10D 30/024* (2025.01); *H10D 30/6211* (2025.01);
(Continued)

(58) Field of Classification Search
CPC ............ H10D 84/834; H10D 30/6211; H10D 84/013; H10D 84/0158; H10D 84/038;
(Continued)

(56) References Cited

U.S. PATENT DOCUMENTS

2007/0004149 A1    1/2007  Tews
2016/0071974 A1    3/2016  Laven et al.
(Continued)

FOREIGN PATENT DOCUMENTS

JP    2019207906 A    12/2019
JP    2021019182 A     2/2021

OTHER PUBLICATIONS

International Search Report for PCT/EP2021/053588, Issued Apr. 29, 2021.

*Primary Examiner* — Shahed Ahmed
(74) *Attorney, Agent, or Firm* — Norton Rose Fulbright US LLP

(57) ABSTRACT

A vertical field-effect transistor. The vertical field-effect transistor includes: a drift area; a first semiconductor fin on or above the drift area and electrically conductively connected thereto; a plurality of second semiconductor fins on or above the drift area, the plurality of second semiconductor fins being formed connected electrically nonconductively to the drift area, the plurality of second semiconductor fins being situated laterally adjacent to at least one side wall of the first semiconductor fin and being electrically conductively connected thereto; and a source/drain electrode, which is electrically conductively connected to the plurality of second semiconductor fins.

11 Claims, 9 Drawing Sheets

(51) Int. Cl.
  *H10D 30/62*    (2025.01)
  *H10D 84/01*    (2025.01)
  *H10D 84/03*    (2025.01)
(52) U.S. Cl.
  CPC ....... *H10D 30/6219* (2025.01); *H10D 84/013* (2025.01); *H10D 84/0158* (2025.01); *H10D 84/038* (2025.01)
(58) Field of Classification Search
  CPC ............... H10D 30/635; H10D 30/025; H10D 62/8325; H10D 62/8503; H10D 62/106; H10D 62/114; H10D 62/235; H10D 64/513; H10D 30/43–435; H10D 62/119–123; H10D 30/62–6219; H10D 30/024–0245
  See application file for complete search history.

(56) References Cited

U.S. PATENT DOCUMENTS

| | | | |
|---|---|---|---|
| 2016/0172482 A1* | 6/2016 | Bobde | H10D 30/022 438/270 |
| 2019/0206743 A1* | 7/2019 | Zang | H10D 84/038 |

\* cited by examiner

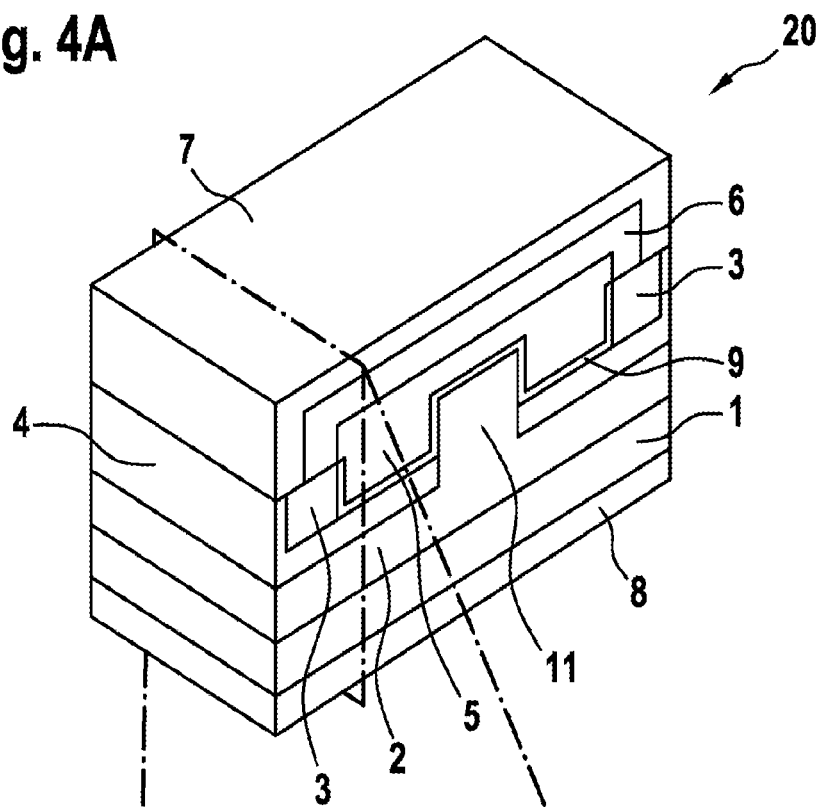
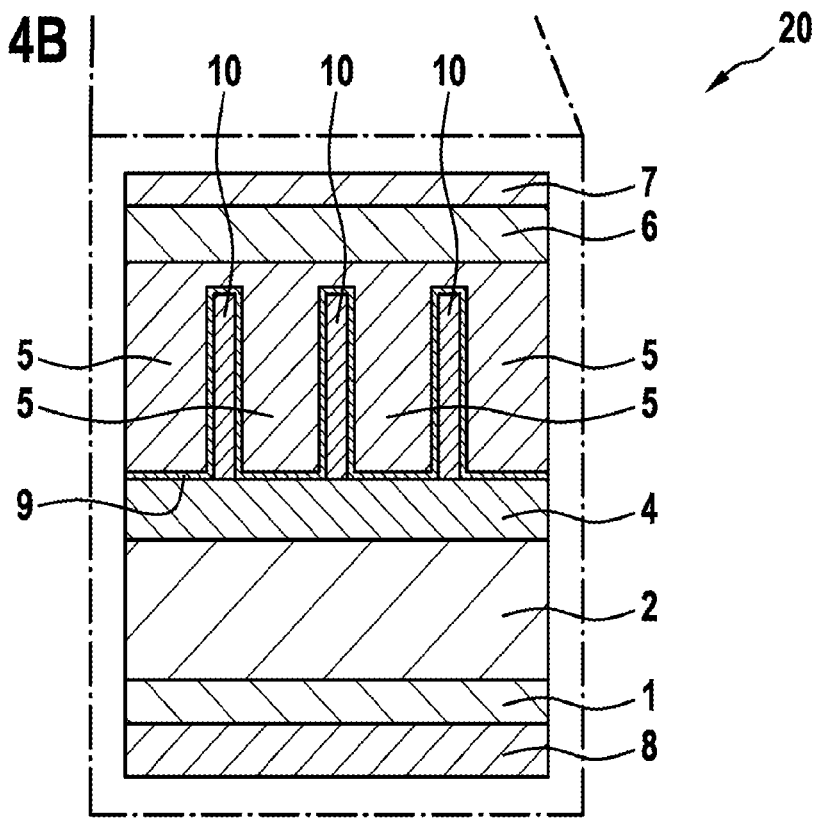

VERTICAL FIELD-EFFECT TRANSISTOR AND METHOD FOR FORMING SAME

FIELD

The present invention relates to a vertical field-effect transistor and a method for forming same.

BACKGROUND INFORMATION

Transistors based on gallium nitride (GaN) or silicon carbide (SiC) offer the possibility of implementing transistors having lower on-resistances with higher breakdown voltages at the same time than comparable components based on silicon.

The use of so-called power FinFETs (FET=field-effect transistor) may be advantageous for the application of semiconductors having a broad bandgap. In a power FinFET, the switchable component is made up of a narrow semiconductor fin, which is switchable due to its geometry and matching selection of the gate metallization. In the power FinFET, the channel area forms in the area of the semiconductor fin at the height of the gate metal.

The structure of a power FinFET of the related art is illustrated in FIG. 1. The conventional power FinFET includes, on a substrate 101, a drift area 102 having an n-doping, a drain electrode 108, a source electrode 107, a gate electrode 105, a semiconductor fin 110, a gate dielectric 109, and an insulation 106. Semiconductor fin 110 is connected with the aid of an n+ doped connection area 103 to source electrode 107. In the power FinFET, the switchable component is made up of narrow semiconductor fin 110, which is switchable due to its geometry and matching selection of gate electrode 105. The channel is formed in narrow, weakly n-doped semiconductor fin 110, which is capable of blocking by natural depletion due to its small width. In contrast to a conventional SiC or GaN MOSFET, p-doping is not required in the channel here. The connection of the channel takes place via accumulation of charge carriers, in contrast to inversion in the classic MOSFET. In this way, significantly higher mobilities of the charge carriers in the channel are enabled. Without applying a gate voltage to gate electrode 105, semiconductor fin 110 is electrically nonconductive, semiconductor fin 110 is depleted. When a positive gate voltage is applied to gate electrode 105, electrons are attracted into semiconductor fin 110 and it thus becomes conductive. Electrons may flow from source electrode 107 through heavily n-doped connection area 103 into semiconductor fin 110, through drift area 102 into substrate 101 and drain electrode 108. For shielding against electrical fields in case of blocking, additional p-doped regions 104 may be introduced into drift area 102, which shield semiconductor fin 110. For the shielding effect of p-regions 104, they have to be situated very precisely in relation to the semiconductor fin. An exact design of p-regions 104 is required for an optimum shielding effect with unimpaired passage performance at the same time. However, perfect shielding of semiconductor fin 110 against high fields is not possible, since the passage properties of semiconductor fin 110 would be excessively impaired in this way.

SUMMARY

An object of the present invention is to provide a vertical field-effect transistor and a method for its formation, which enables a semiconductor fin having an improved blocking effect.

The object may be achieved according to one aspect of the present invention by a vertical field-effect transistor. According to an example embodiment of the present invention, the vertical field-effect transistor includes: a drift area, a first semiconductor fin on or above the drift area and electrically conductively connected thereto, a plurality of second semiconductor fins on or above the drift area, the plurality of second semiconductor fins being formed electrically nonconductively connected to the drift area, the plurality of second semiconductor fins being situated laterally adjacent to at least one side wall of the first semiconductor fin and being electrically conductively connected thereto, and a source/drain electrode, which is electrically conductively connected to the plurality of second semiconductor fins. As an illustration, a power FinFET including a horizontal channel region is provided, which is flatly electrically insulated downward completely in relation to the drift area. The vertical current conduction takes place through the first semiconductor fin at the end of the second semiconductor fins. The high channel mobility within the second semiconductor fins may be implemented in this way with ideal shielding of the second semiconductor fins in relation to electrical fields in the blocking case at the same time.

The object may be achieved according to a further aspect of the present invention by a method for forming a vertical field-effect transistor. According to an example embodiment of the present invention, the method includes: forming a drift area, forming a first semiconductor fin on or above the drift area and electrically conductively connecting it thereto, forming a plurality of second semiconductor fins on or above the drift area, the plurality of second semiconductor fins being formed connected electrically nonconductively to the drift area, the plurality of second semiconductor fins being situated laterally adjacent to at least one side wall of the first semiconductor fin and being electrically conductively connected thereto, and forming a source/drain electrode, which is electrically conductively connected to the plurality of second semiconductor fins. This enables the manufacturing of vertical field-effect transistors having improved shielding with respect to field peaks in the blocking mode.

Refinements of the aspects of the present invention are disclosed herein. Specific embodiments of the present invention are shown in the figures and are explained in greater detail hereinafter.

BRIEF DESCRIPTION OF THE DRAWINGS

FIG. 4A shows a schematic perspective view of a vertical field-effect transistor according to various specific embodiments of the present invention.

FIG. 4B shows a schematic cross-sectional view of FIG. 4A.

DETAILED DESCRIPTION OF EXAMPLE EMBODIMENTS

Figure 1:
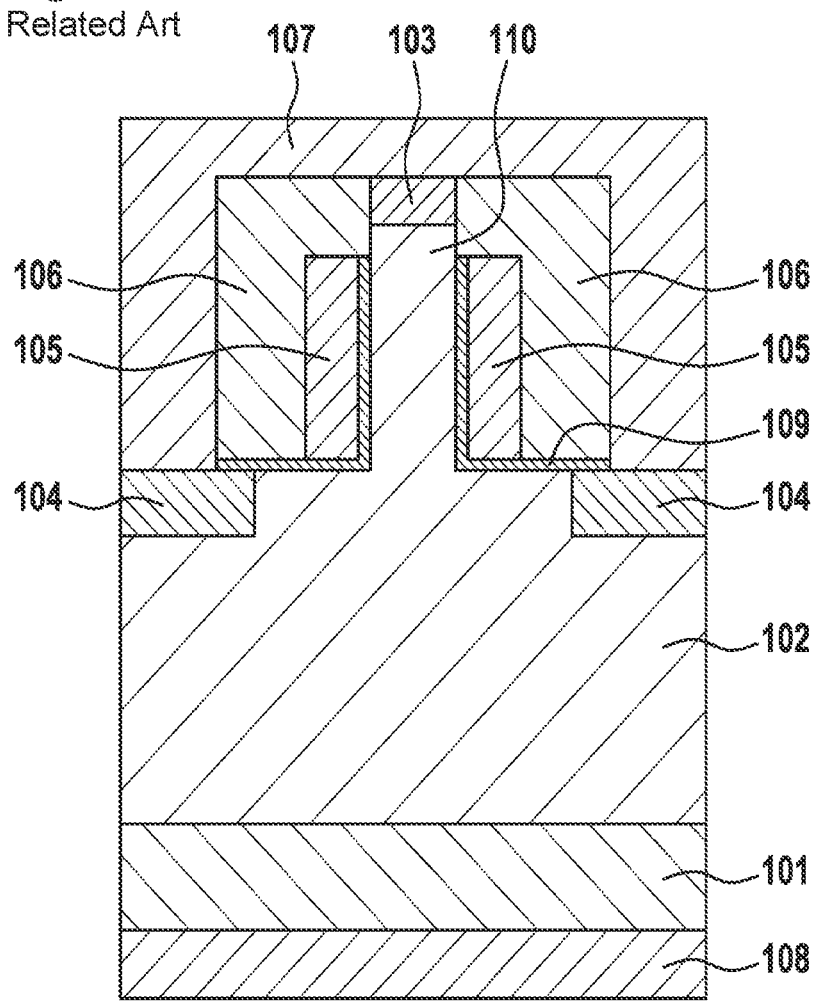
FIG. 1 shows a schematic representation of a vertical field-effect transistor of the related art.

In the following detailed description, reference is made to the figures, which form part of this description and in which specific exemplary embodiments are shown for illustration, in which the present invention may be implemented. It shall be understood that other exemplary embodiments may be used and structural or logical changes may be carried out without departing from the scope of protection of the present invention. It shall be understood that the features of the various exemplary embodiments described herein may be combined with one another if not specifically indicated otherwise. The following detailed description is therefore not to be interpreted in a restricted meaning. In the figures, identical or similar elements are provided with identical reference numerals, if appropriate.

FIG. 2A through FIG. 2D show schematic perspective views of a vertical field-effect transistor 20 according to various specific embodiments. In various specific embodiments, vertical field-effect transistor 20 includes a drift area 2 on a semiconductor substrate 1. Vertical field-effect transistor 20 furthermore includes a first semiconductor fin 11 on or above drift area 2 and electrically conductively connected thereto, and includes a plurality of second semiconductor fins 10 on or above drift area 2, the plurality of second semiconductor fins 10 being formed connected electrically nonconductively to the drift area 2. That is to say, there is no direct physical and/or electrically conductive contact between drift area 2 and second semiconductor fins 10. The plurality of second semiconductor fins 10 are situated laterally adjacent to at least one side wall of first semiconductor fin 11 and are electrically conductively connected thereto. First semiconductor fin 11 may include a first side wall and a second side wall which is opposite to the first side wall and the plurality of second semiconductor fins 10 may be situated laterally adjacent to the first side wall and the second side wall of first semiconductor fin 11 and may be electrically conductively connected thereto.

A shielding structure 4 may be formed between the plurality of second semiconductor fins 10 and drift area 2. This enables, for example, the second semiconductor fins to be formed on drift area 2 while electrically nonconductively connected to drift area 2. A direct physical and/or electrically conductive contact between drift area 2 and second semiconductor fins 10 lying above it is thus prevented by interposed shielding structure 4. Shielding structure 4 may be electrically conductively connected to a first source/drain electrode 7. The plurality of second semiconductor fins 10 may include a first conductivity type and shielding structure 4 may include a second conductivity type which differs from the first conductivity type. Shielding structure 4 may include an intrinsically conductive semiconductor or may be formed therefrom. Shielding structure 4 may alternatively or additionally be p-doped. This enables electrical shielding of second semiconductor fins 10 with respect to drift area 2 and protects second semiconductor fins 10 from electrical field peaks in the blocking mode.

Furthermore, a second source/drain electrode (for example, a drain electrode 8) is provided. It is assumed by way of example hereinafter that the first source/drain electrode is a source electrode 7 and the second source/drain electrode is a drain electrode 8. Furthermore, a connection area 3 may be provided, which is formed between source/drain electrode 7 and each of second semiconductor fins 10, connection area 3 having a higher conductivity than second semiconductor fins 10.

Vertical field-effect transistor 20 furthermore includes a gate electrode 5 laterally adjacent to at least one side wall of each of second semiconductor fins 10, gate electrode 5 being electrically insulated from source electrode 7 with the aid of an insulation layer 6. A gate dielectric 9 is situated in each case between gate electrode 5 and the at least one side wall of second semiconductor fins 10.

Figure 2A:
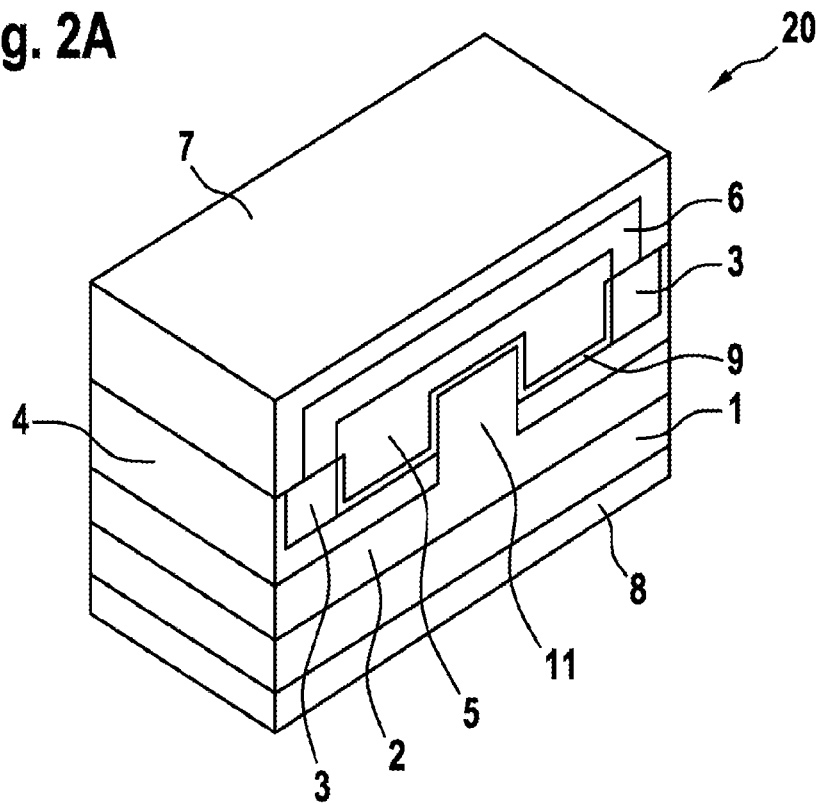
FIGS. 2A through 2D show schematic perspective views of a vertical field-effect transistor according to various specific embodiments of the present invention.
Figure 2B:
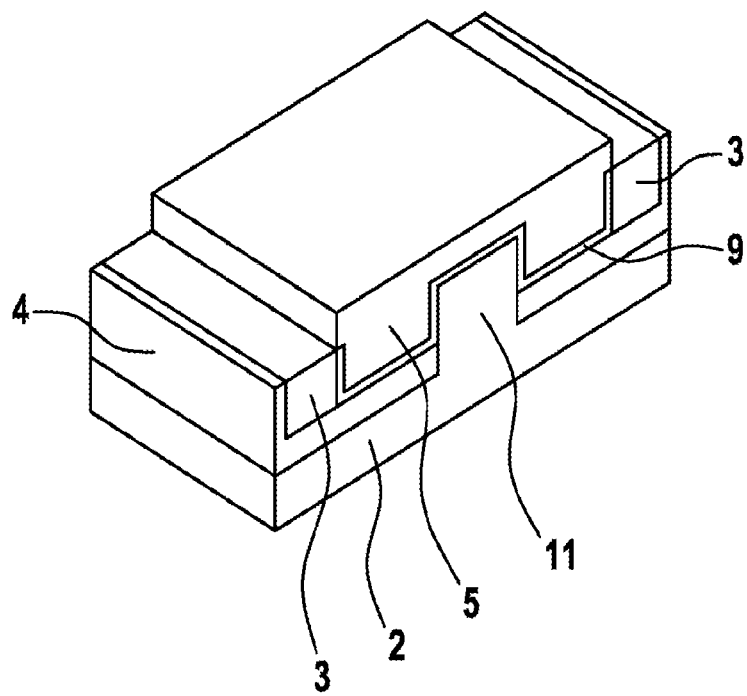
Figure 2C:
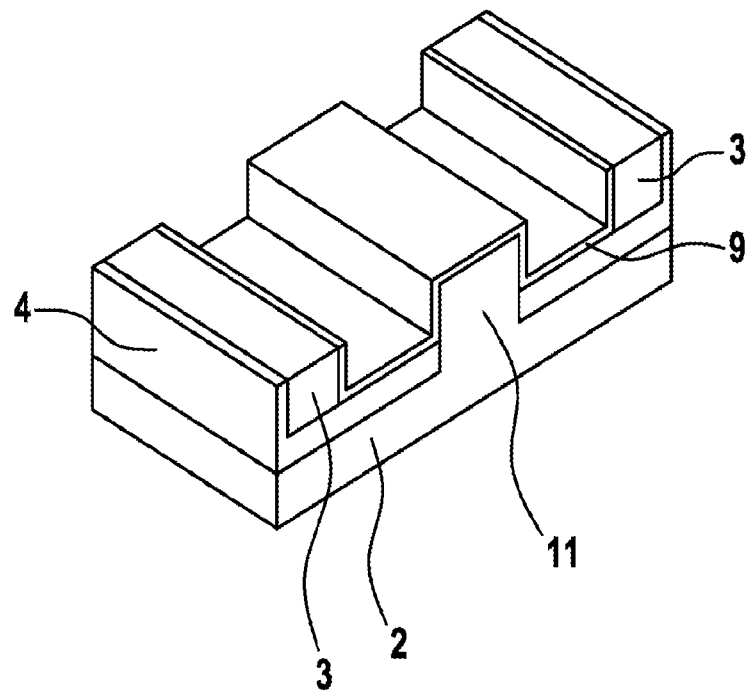
Figure 2D:
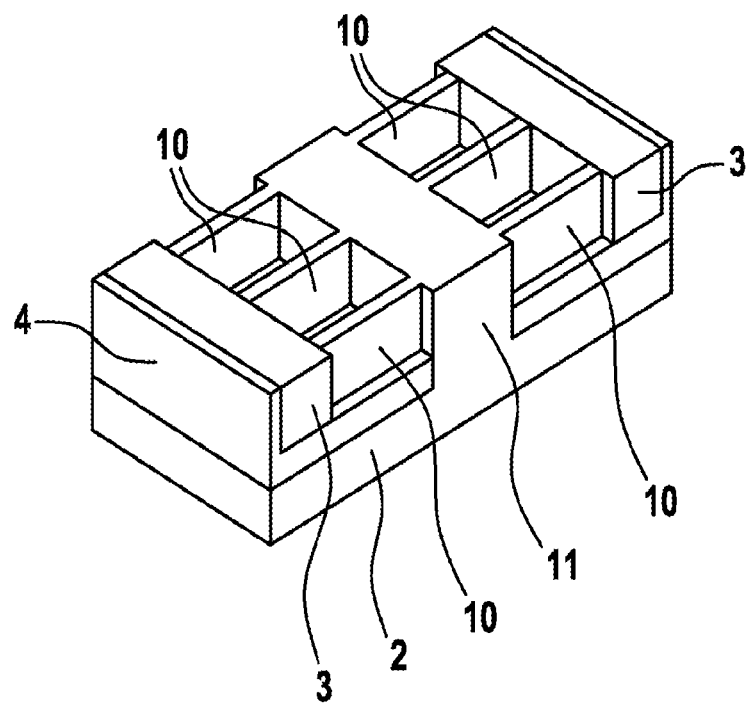

FIG. 2A shows the entire vertical field-effect transistor 20. The structure from FIG. 2A is shown in FIG. 2B without source and drain electrode 7, 8 and insulation layer 6. The structure of FIG. 2B is shown without gate electrode 5 in FIG. 2C. The structure of FIG. 2C is shown without gate dielectric 9 in FIG. 2D.

FIGS. 2A through 2D each schematically show a single FinFET cell according to various specific embodiments. In general, many hundreds to thousands of such cells are connected in parallel and the structure continues in the third dimension into the plane. A two-dimensionally extended field of FinFET cells results due to combinations of multiple cells. The vertical field-effect transistor may be a power semiconductor component. As an example: semiconductor substrate 1 may be a GaN substrate 1 or an SiC substrate 1. A weakly n-conductive semiconductor drift area 2 may be formed (for example, applied) on semiconductor substrate 1, for example, a GaN drift area 2 or a SiC drift area 2. An n-conductive semiconductor region in the form of first and second semiconductor fins 10, 11 may be formed above drift area 2, for example, in the form of GaN or SiC fins. Connection area 3 may include an n+ doped semiconductor material or may be formed therefrom.

For the function of vertical field-effect transistor 20 as a transistor or switch, a second semiconductor fin 10 has, for example, in each case a lateral extension (visible as the width in FIG. 4B) in the range of approximately 100 nm to approximately 200 nm and a vertical extension (visible as the height in FIG. 4B) in the range of approximately 0.1 μm to approximately 3 μm.

Figure 3:
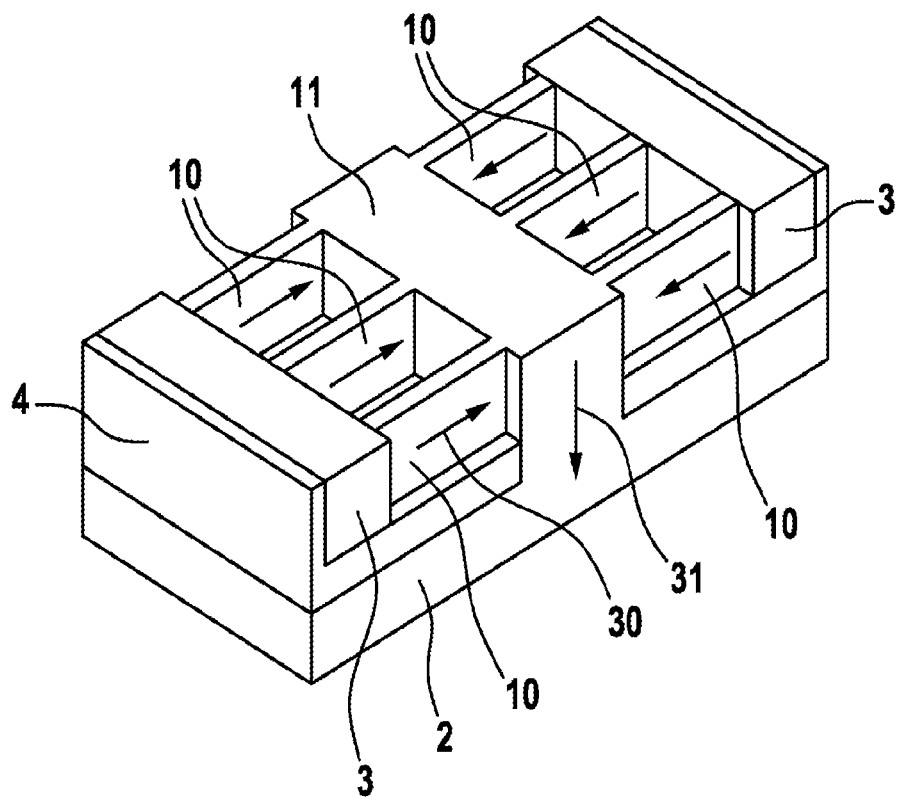
FIG. 3 shows a schematic representation of a current flow in a vertical field-effect transistor according to various specific embodiments of the present invention.

FIG. 3 shows a schematic representation of a current flow in a vertical field-effect transistor according to various specific embodiments.

Shielding structure 4, for example, in the form of a p-doped region 4, is formed between second semiconductor fins 10 and drift area 2. Shielding structure 4 may be electrically connected to source contact 7. Shielding structure 4 shields second semiconductor fins 10 and gate dielectric 9 enclosing second semiconductor fins 10 against electrical fields which may occur in the blocking mode. Shielding structure 4 enables the current flow to take place horizontally through second semiconductor fins 10 and to only extend vertically in first semiconductor fin 11.

By applying a positive gate voltage to gate electrode 5, electrons are accumulated in narrow second semiconductor fins 10. Second semiconductor fins 10 thus become electrically conductive. Electrons may flow from source electrode 7 through the strong n-doping of connection area 3 into second semiconductor fins 10. They flow there along the second semiconductor fins in the horizontal direction (illustrated with the aid of arrow 30 in FIG. 3) up to first semiconductor fin 11. In first semiconductor fin 11, the electrons are suctioned up vertically by the voltage applied to drain electrode 8 (illustrated with the aid of arrow 31 in FIG. 3). The electrons accordingly flow through drift area 2 and substrate 1 into drain electrode 8.

Without application of a gate voltage, field-effect transistor 20 may be self-blocking, since the electron gas below first semiconductor fin 11 may be depleted in drift area 2.

FIG. 4A shows a schematic perspective view of a vertical field-effect transistor 20 according to various specific embodiments and FIG. 4B shows a schematic cross-sectional view of FIG. 4A. Vertical field-effect transistor 20 shown in FIG. 4A may be identical to vertical field-effect transistor 20 shown in FIG. 2A through FIG. 2D, which is described in greater detail above.

FIG. 4B illustrates that second semiconductor fins 10, which form the channel of vertical field-effect transistor 20, are completely electrically shielded downward or toward drift area 2 by shielding structure 4.

FIG. 5A through FIG. 6D show schematic, perspective views of various specific embodiments of a vertical field-effect transistor.

Figure 5A:
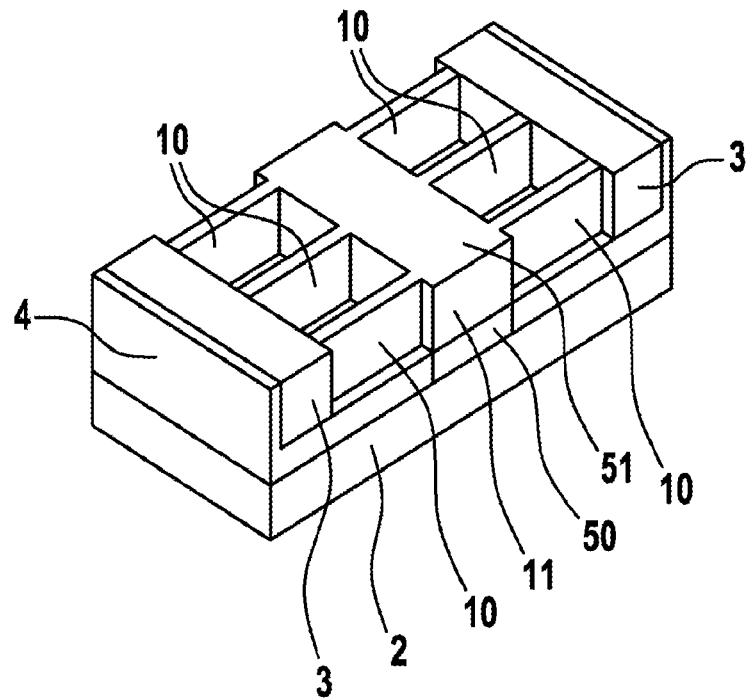
FIGS. 5A through 6D show schematic perspective views of various specific embodiments of a vertical field-effect transistor of the present invention.
Figure 5B:
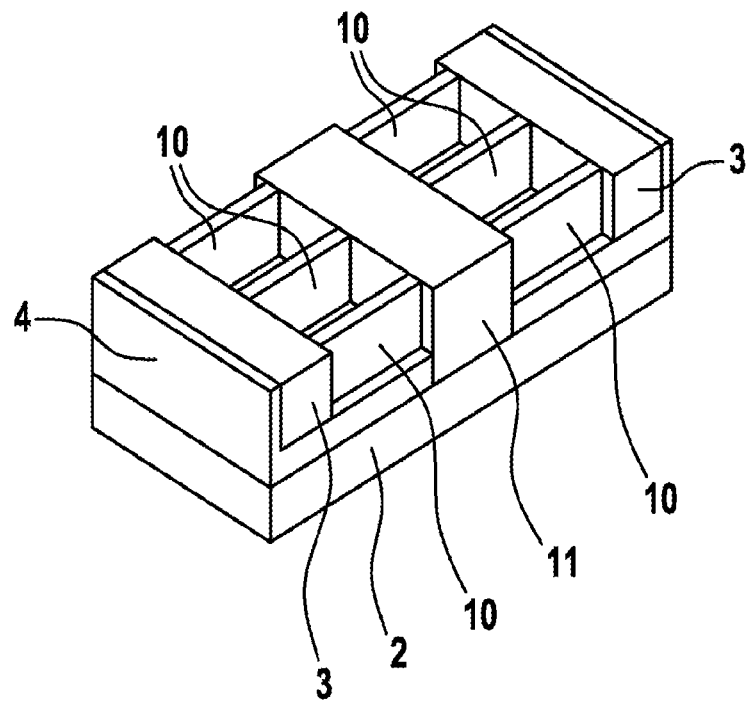

The electric current is only discharged downward in various specific embodiments by first semiconductor fin 11, as was described in FIG. 3. In one specific embodiment, first semiconductor fin 11 may include a first section 50 including an elevated n-doping and a second section 51 including a lower n-doping in comparison to second semiconductor fins 10 (FIG. 5A). First section 50 may be formed laterally adjacent to shielding structure 4. It may have the same thickness as the shielding structure (FIG. 5A) or may have a different thickness than the shielding structure. In another specific embodiment, entire first semiconductor fin 11 may include an elevated n-doping (in comparison to a doping of second semiconductor fins 10) (FIG. 5B).

In other words: in various specific embodiments, first semiconductor fin 11 includes a first section 50, which is formed laterally adjacent to shielding structure 4, for example, and includes a second section 51, which is situated laterally adjacent to second semiconductor fins 10, for example, first section 50 being formed doped more strongly than second section 51, as illustrated in FIG. 5A. This enables the first semiconductor fin to be sufficiently electrically conductive that an electrical current flow of vertical field-effect transistor 20 is not restricted. This is advantageous in particular in the lower area of first semiconductor fin 11, which is closest to drift area 2 and is situated laterally adjacent to shielding structure 4. In this area of drift area 2, a reduced charge carrier density may be present due to the depletion of charge carriers caused with the aid of shielding structure 4. The spatial extension of this depletion zone may be reduced by the local or complete n-doping of first semiconductor fin 11 in first section 50 and a larger area may be available for the vertical current flow.

Second semiconductor fins 10 may increase in their lateral extension (width) in the direction of drift area 2 in various specific embodiments. This increases the stability of second semiconductor fins 10. Due to shielding structure 4, for example, p-doped shielding structure 4, it is possible that second semiconductor fins 10 may still be self-blocking in spite of the increasing width.

Figure 6A:
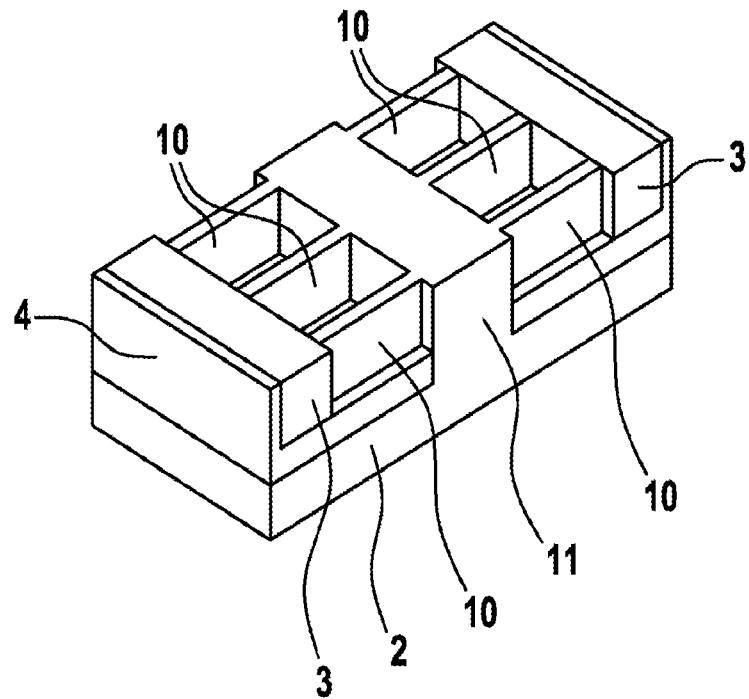

In various specific embodiments, shielding structure 4 extends into the area of second semiconductor fins 10, as illustrated in FIG. 6A. In other words: shielding structure 4 may extend in each case in the direction of second semiconductor fins 10 in such a way that a base of a second semiconductor fin 10 is situated vertically above a base of first semiconductor fin 11. This may ensure or strengthen the self-blocking effect of second semiconductor fins 10.

Figure 6B:
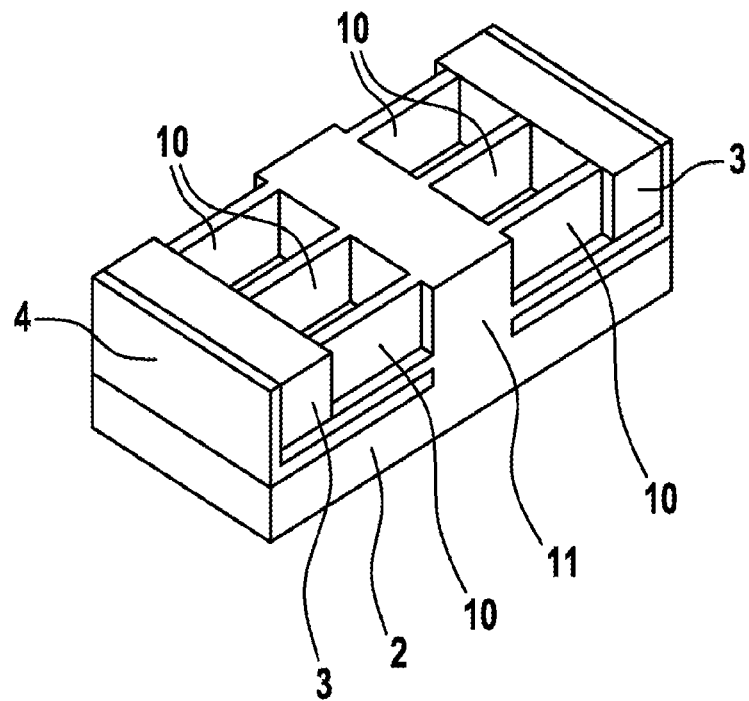

Alternatively or additionally, shielding structure 4 may be formed at a vertical distance to second semiconductor fins 10, as illustrated in FIG. 6B. The distance or the doping of shielding structure 4 may be selected in such a way that a depletion of the area below second semiconductor fin 10 is ensured. In other words: second semiconductor fins 10 may each include a first section, which is closest to drift area 2, and may include a second section on the first section, each second semiconductor fin 10 including a first lateral extension in the first section and including in the second section a second lateral extension, which is less than the first lateral extension. For example, the second semiconductor fins may be connected to one another in the area of the first sections. As an illustration, the second semiconductor fins may include a shared base plate.

Figure 6C:
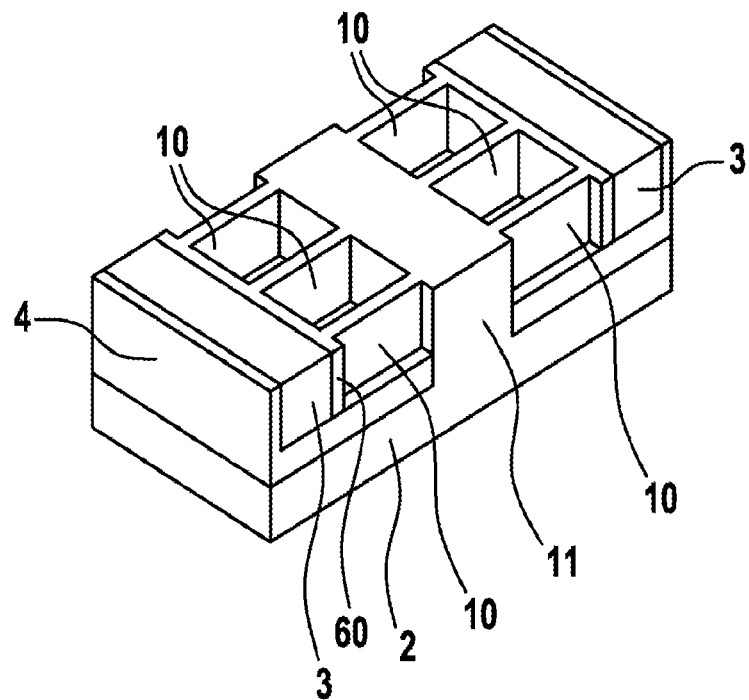

In various specific embodiments, the lateral extension of connection area 3 or the stronger n-doping at source electrode 7 may end before second semiconductor fins 10, as illustrated in FIG. 6C. In other words: a connecting structure 60 may be formed between connection area 3 and second semiconductor fins 10, which may include the same doping as second semiconductor fins 10 and is electrically conductively connected to the plurality of second semiconductor fins 10, connecting structure 60 being spaced apart from the at least one side wall of first semiconductor fin 11.

Figure 6D:
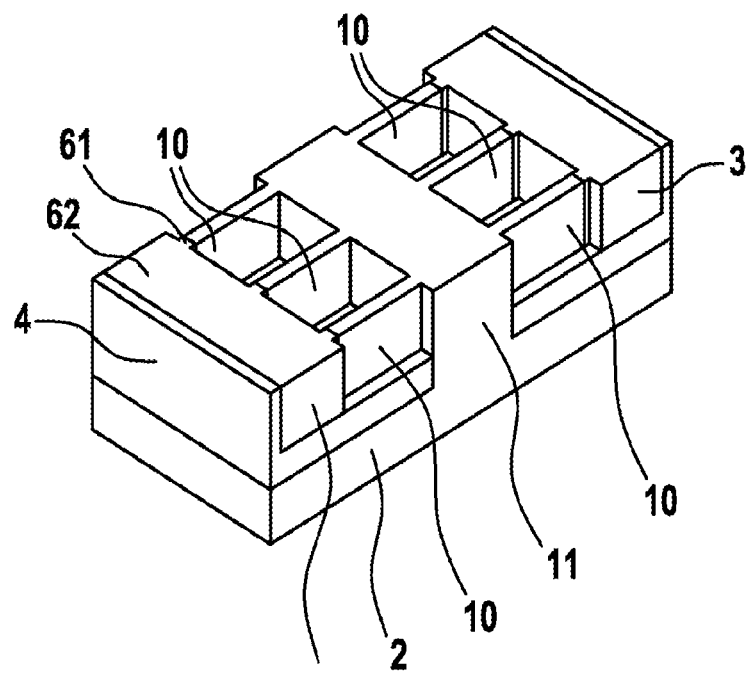

Alternatively or additionally, connection area 3 may extend into the area of second semiconductor fins 10, as shown in FIG. 6D. In other words: connection area 3 may include a plurality of first sections 61, which each extend in the direction of a second semiconductor fin 10 and to each of which one of second semiconductor fins 10 is electrically conductively connected, and may include a second section 62, which is situated laterally adjacent to first section 61 and connects the plurality of first sections 61 and source/drain electrode 7 to one another.

Figure 7:
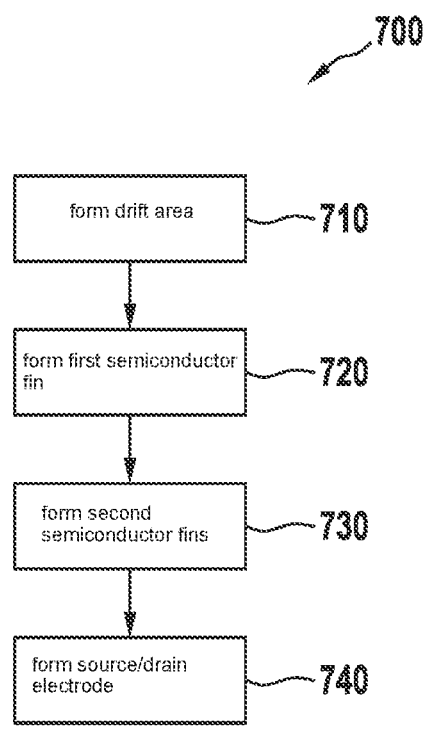
FIG. 7 shows a flowchart of a method for forming a vertical field-effect transistor according to various specific embodiments of the present invention.

FIG. 7 shows a flowchart of a method 700 for forming a vertical field-effect transistor according to various specific embodiments. Vertical field-effect transistor 20 formed with the aid of method 700 may correspond to an above-described specific embodiment. Method 700 includes: forming 710 a drift area 2, forming 720 a first semiconductor fin 11 on or above drift area 2 and connecting it thereto in an electrically conductive manner, forming 730 a plurality of second semiconductor fins 10 on or above drift area 2, the plurality of second semiconductor fins 10 being formed connected electrically nonconductively to drift area 2, the plurality of second semiconductor fins 10 being situated laterally adjacent to at least one side wall of the first semiconductor fin and being electrically conductively connected thereto, and forming 740 a source/drain electrode 7, which is electrically conductively connected to the plurality of second semiconductor fins 10.

The specific embodiments which are described and shown in the figures are only selected as examples. Different specific embodiments may be combined with one another completely or with respect to individual features. One specific embodiment may also be supplemented by features of another specific embodiment. Furthermore, described method steps may be carried out repeatedly and in a sequence other than that described. In particular, the present invention is not restricted to the indicated method.

What is claimed is:

1. A vertical field-effect transistor, comprising:
   a drift area;
   a first semiconductor fin on or above the drift area and electrically conductively connected to the drift area;
   a plurality of second semiconductor fins on or above the drift area, the plurality of second semiconductor fins being formed connected electrically nonconductively to the drift area, the plurality of second semiconductor fins being situated laterally adjacent to at least one side wall of the first semiconductor fin and being electrically conductively connected to the at least one side wall of the first semiconductor fin; and a source/drain electrode which is electrically conductively connected to the plurality of second semiconductor fins.

2. The vertical field-effect transistor as recited in claim 1, wherein the first semiconductor fin includes a first side wall and a second side wall, which is opposite to the first side wall, and the plurality of second semiconductor fins are situated laterally adjacent to the first side wall and the second side wall of the first semiconductor fin and are electrically conductively connected to the first side wall and the second side wall of the first semiconductor fin.

3. The vertical field-effect transistor as recited in claim 1, further comprising:

a shielding structure, which is formed between the plurality of second semiconductor fins and the drift area.

4. The vertical field-effect transistor as recited in claim 3, wherein the shielding structure is electrically conductively connected to the source/drain electrode.

5. The vertical field-effect transistor as recited in claim 3, wherein the first semiconductor fin includes a first section, which is formed laterally adjacent to the shielding structure, and includes a second section, which is situated laterally adjacent to the second semiconductor fins, the first section being formed more strongly doped than the second section.

6. The vertical field-effect transistor as recited in claim 3, wherein the shielding structure in each case extends in a direction of the second semiconductor fins in such a way that a base of the second semiconductor fin is situated vertically above a base of the first semiconductor fin.

7. The vertical field-effect transistor as recited in claim 3, wherein the second semiconductor fins each include a first section, which is closest to the drift area, and include a second section on the first section, each second semiconductor fin includes a first lateral extension in the first section and includes in the second section a second lateral extension, which is less than the first lateral extension.

8. The vertical field-effect transistor as recited in claim 1, further comprising:

a connecting structure, which is electrically conductively connected to the plurality of second semiconductor fins, the connecting structure being spaced apart from the at least one side wall of the first semiconductor fin.

9. The vertical field-effect transistor as recited in claim 1, further comprising:

a connection area, which is formed between the source/drain electrode and each of the second semiconductor fins, the connection area having a higher conductivity than the second semiconductor fins.

10. The vertical field-effect transistor as recited in claim 9, wherein the connection area includes a plurality of first sections, which each extend in a direction of a second semiconductor fin and are each electrically conductively connected to one of the second semiconductor fins, and includes a second section, which is situated laterally adjacent to the first section and connects the plurality of first sections and the source/drain electrode to one another.

11. A method for forming a vertical field-effect transistor, the method comprising the following steps:

forming a drift area;

forming a first semiconductor fin on or above the drift area and connecting the first semiconductor fin to the drift area in an electrically conductive manner;

forming a plurality of second semiconductor fins on or above the drift area, the plurality of second semiconductor fins being connected electrically nonconductively to the drift area, the plurality of second semiconductor fins being situated laterally adjacent to at least one side wall of the first semiconductor fin and being electrically conductively connected to the at least one side wall of the first semiconductor fin; and forming a source/drain electrode, which is electrically conductively connected to the plurality of second semiconductor fins.

\* \* \* \* \*